US 11,640,094 B2

(12) United States Patent
Lo et al.

(10) Patent No.: US 11,640,094 B2
(45) Date of Patent: *May 2, 2023

(54) DISPLAY DEVICE AND ARRAY STRUCTURE

(71) Applicant: E Ink Holdings Inc., Hsinchu (TW)

(72) Inventors: Chang-Cheng Lo, Hsinchu (TW); Shi-Lin Li, Hsinchu (TW); Ji-Yuan Li, Hsinchu (TW); Yi-Lung Wen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/364,914

(22) Filed: Jul. 1, 2021

(65) Prior Publication Data

US 2021/0325708 A1 Oct. 21, 2021

Related U.S. Application Data

(63) Continuation of application No. 16/866,539, filed on May 4, 2020, now Pat. No. 11,099,444.

(30) Foreign Application Priority Data

May 17, 2019 (TW) .................. 108117198

(51) Int. Cl.
*G02F 1/1368* (2006.01)
*G02F 1/1333* (2006.01)
*H01L 27/12* (2006.01)

(52) U.S. Cl.
CPC ........ *G02F 1/1368* (2013.01); *H01L 27/1248* (2013.01); *G02F 1/133357* (2021.01); *G02F 2201/121* (2013.01); *G02F 2201/123* (2013.01); *G02F 2202/28* (2013.01); *G02F 2202/42* (2013.01)

(58) Field of Classification Search
CPC ............ G02F 1/1368; G02F 1/133357; G02F 2201/121; G02F 2201/123; G02F 2202/28; G02F 2202/42; H01L 27/1248
USPC .............................................. 349/86–91, 138
See application file for complete search history.

(56) References Cited

U.S. PATENT DOCUMENTS

| 7,030,412 | B1 | 4/2006 | Drzaic | |
|---|---|---|---|---|
| 11,099,444 | B2 * | 8/2021 | Lo | .............. G02F 1/1368 |
| 2003/0173890 | A1 * | 9/2003 | Yamazaki | ............ G02B 26/026 |
| | | | | 313/498 |
| 2006/0275618 | A1 | 12/2006 | Kugimiya et al. | |

(Continued)

FOREIGN PATENT DOCUMENTS

| TW | 201220271 A | 5/2012 |
|---|---|---|
| TW | 201614830 A | 4/2016 |
| TW | 201826353 A | 7/2018 |

OTHER PUBLICATIONS

Corresponding Taiwan office action dated Mar. 10, 2020.

*Primary Examiner* — Charles S Chang
(74) *Attorney, Agent, or Firm* — CKC & Partners Co., LLC

(57) ABSTRACT

A display device includes a thin film transistor (TFT) array substrate, an isolation structure, and a front panel laminate (FPL) structure. The TFT array substrate has pixel electrodes. The isolation structure is between the pixel electrodes to form a first resistance between adjacent pixel electrodes. The front panel laminate structure is located on the isolation structure and the pixel electrodes adhesive layer, and has a display medium layer therein.

16 Claims, 5 Drawing Sheets

(56) References Cited

U.S. PATENT DOCUMENTS

| | | |
|---|---|---|
| 2008/0001154 A1 | 1/2008 | Lee |
| 2016/0104760 A1 | 4/2016 | Maeda |
| 2017/0250362 A1* | 8/2017 | Hiraga ................ H01L 51/5056 |
| 2017/0250367 A1* | 8/2017 | Yasukawa ............. H01L 51/525 |
| 2018/0374914 A1 | 12/2018 | Maeda |
| 2019/0074339 A1* | 3/2019 | Ma ........................ H01L 27/323 |

* cited by examiner

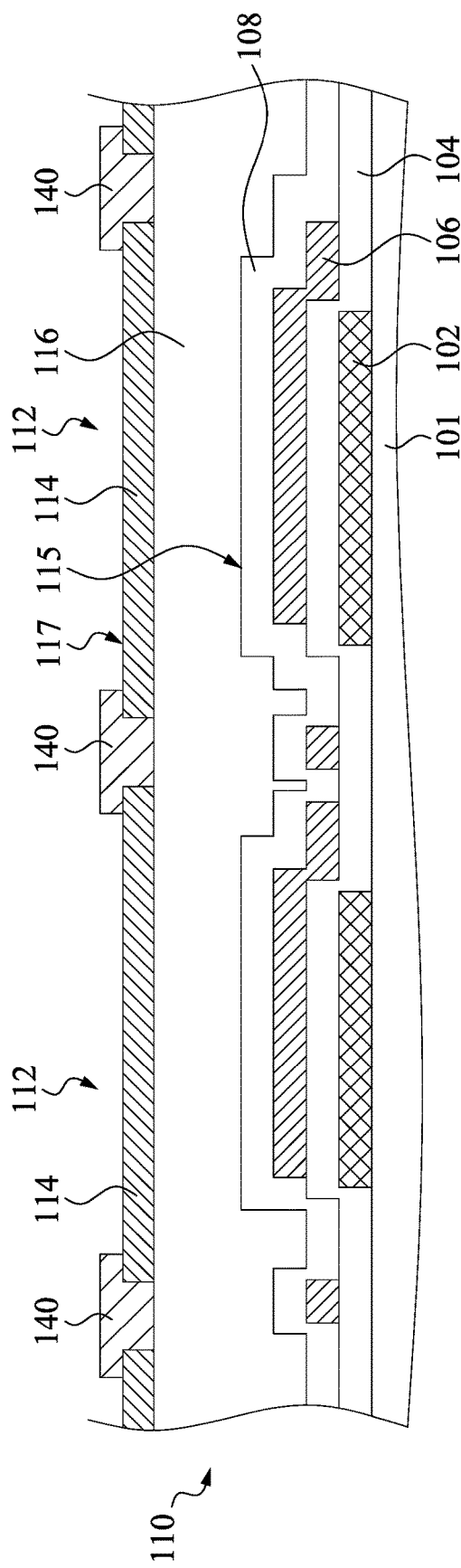
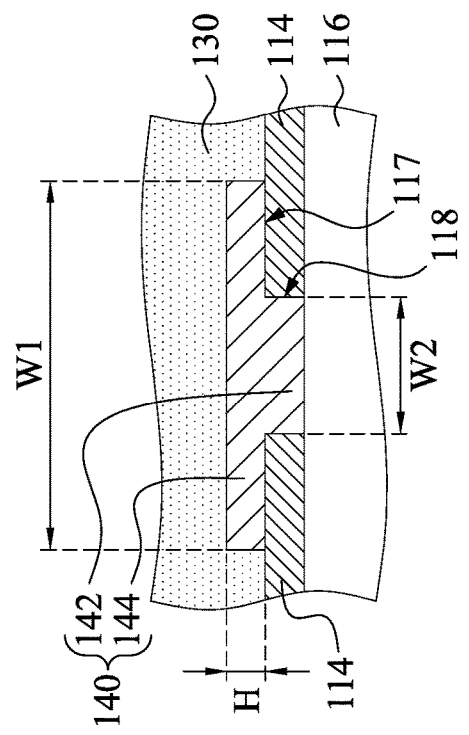
Fig. 4A
Fig. 4B

DISPLAY DEVICE AND ARRAY STRUCTURE

RELATED APPLICATIONS

This present application is a continuation application of U.S. patent application Ser. No. 16/866,539, filed May 4, 2020, which claims priority to Taiwan Application Serial Number 108117198, filed May 17, 2019, all of which are herein incorporated by reference in their entirety.

BACKGROUND

Field of Invention

The present invention relates to a display device and a thin film transistor array substrate, especially relates to a display device having an isolation structure and a thin film transistor array substrate having an isolation structure.

Description of Related Art

In a market with a wide variety of consumer electronic products, reflective display devices have been extensively utilized as display screens in electronic products, such as electronic papers. A reflective display device has a display medium layer that mainly consists of an electrophoresis buffer and white and black charged particles that are in the electrophoresis buffer. Under a voltage application to the display medium layer, the white and black charged particles are driven to move, so that each pixel of the display medium layer displays black, white or a gray level. Since the reflective display device utilizes incident light that irradiates the display medium layer to realize displaying, such as sunlight or indoor ambient light, the reflective display device needs no backlight, which reduces power consumption.

In general, an electronic paper display device is formed by adhering a front panel laminate (FPL) having a display medium layer to a thin film transistor (TFT) array substrate through an optical clear adhesive. Because the optical clear adhesive is in contact with pixel electrodes and has a slight conductivity at a high-temperature ambience greater than 40° C., parallel voltages between pixel areas would be leak through the optical clear adhesive to further affect display quality.

SUMMARY

An aspect of the present invention is to provide a display device.

According to an embodiment of the present invention, a display device includes a thin film transistor (TFT) array substrate, an isolation structure, and a front panel laminate (FPL) structure. The TFT array substrate has a plurality of pixel electrodes. The isolation structure is between the pixel electrodes and is configured to form a first resistance between adjacent pixel electrodes. The FPL structure is located on the isolation structure and the pixel electrodes, and has a display medium layer therein.

In one embodiment of the present invention, the FPL structure further includes an adhesive layer that covers the pixel electrodes and the isolation structure, and the adhesive layer has a second resistance.

In one embodiment of the present invention, the isolation structure extends to top surfaces of the pixel electrodes.

In one embodiment of the present invention, the isolation structure has a bottom portion and a top portion on the bottom portion, and a width of the top portion is greater than a width of the bottom portion.

In one embodiment of the present invention, the bottom portion of the isolation structure is in contact with sidewalls of the pixel electrodes.

In one embodiment of the present invention, the top portion of the isolation structure is in contact with an adhesive layer of the FPL structure and top surfaces of the pixel electrodes.

In one embodiment of the present invention, the isolation structure is made of a material including silicon nitride or silicon oxide.

In one embodiment of the present invention, the FPL structure further has a light-transmissive sheet and a common electrode, the common electrode is located on a bottom surface of the light-transmissive sheet, and the display medium layer is located between the common electrode and the adhesive layer.

In one embodiment of the present invention, the TFT array substrate has a plurality of pixel areas, and each of the pixel areas is surrounded by the isolation structure.

In one embodiment of the present invention, the TFT array substrate has a plurality of thin film transistors and a planarization layer that covers the thin film transistors, and the pixel electrodes and the isolation structure are located on the planarization layer.

In one embodiment of the present invention, a dielectric constant of the planarization layer is smaller than a dielectric constant of the isolation structure.

An aspect of the present invention is to provide a thin film transistor (TFT) array substrate.

According to an embodiment of the present invention, a TFT array substrate includes a substrate, a first metal layer, a first isolation layer, a second metal layer, a second isolation layer, a planarization layer, a plurality of pixel electrodes, and an isolation structure. The first metal layer is disposed on the substrate. The first isolation layer covers the first metal layer. The second metal layer is disposed on the first isolation layer. The second isolation layer covers the second metal layer. The planarization layer is disposed on the substrate and covers the second isolation layer. The pixel electrodes are disposed on the planarization layer. The isolation structure is disposed on the planarization layer and is between the pixel electrodes, and is configured to form a first resistance between adjacent pixel electrodes.

In one embodiment of the present invention, a dielectric constant of the planarization layer is smaller than a dielectric constant of the isolation structure.

In one embodiment of the present invention, the isolation structure has a bottom portion and a top portion on the bottom portion, and a width of the top portion is greater than a width of the bottom portion.

In one embodiment of the present invention, the isolation structure partially covers the pixel electrodes.

In one embodiment of the present invention, the TFT array substrate further includes an adhesive layer that covers the pixel electrodes and the isolation structure, and the adhesive layer has a second resistance.

In the aforementioned embodiments of the present invention, because the display device has the isolation structure located between the pixel electrodes and extending to the top surfaces of the pixel electrodes, lateral resistances of the pixel electrodes may be referred to as the sum of the resistances of the isolation structure and the adhesive layer. As a result, even if the adhesive layer has a slight conductivity at a high-temperature ambience, the configuration of the isolation structure can prevent parallel voltages between pixel areas from electric leakage through the adhesive layer, thereby improving display quality.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 4A is a cross-sectional view of the display area taken along line 4-4 shown in FIG. 3;

FIG. 4B is a partially enlarged view of an isolation structure and a pixel electrode shown in FIG. 4A after being covered by an adhesive layer;

DETAILED DESCRIPTION

Figure 1:
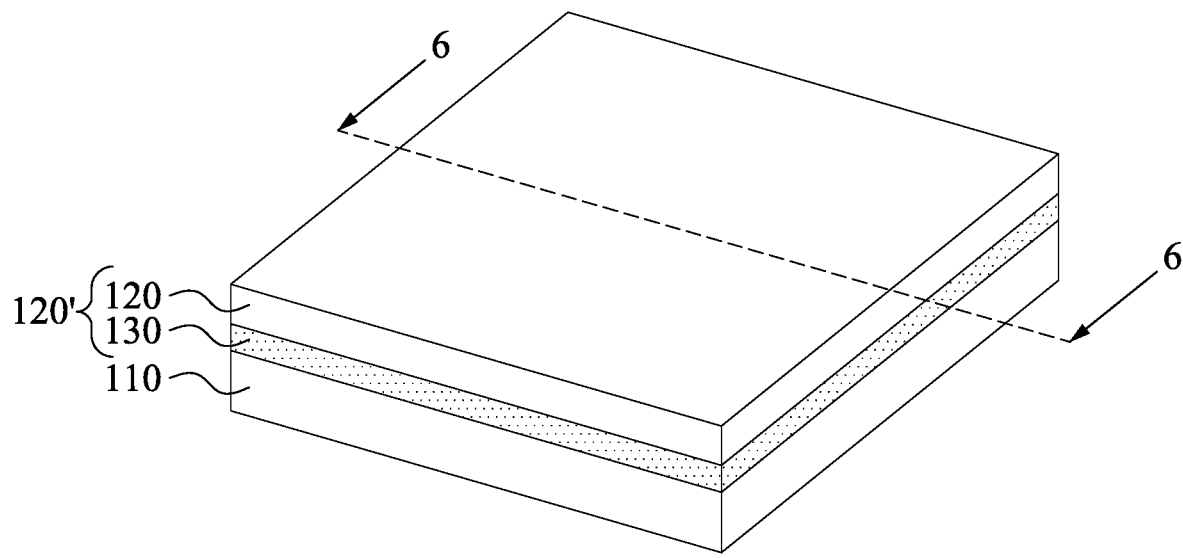
FIG. 1 is a perspective view of a display device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
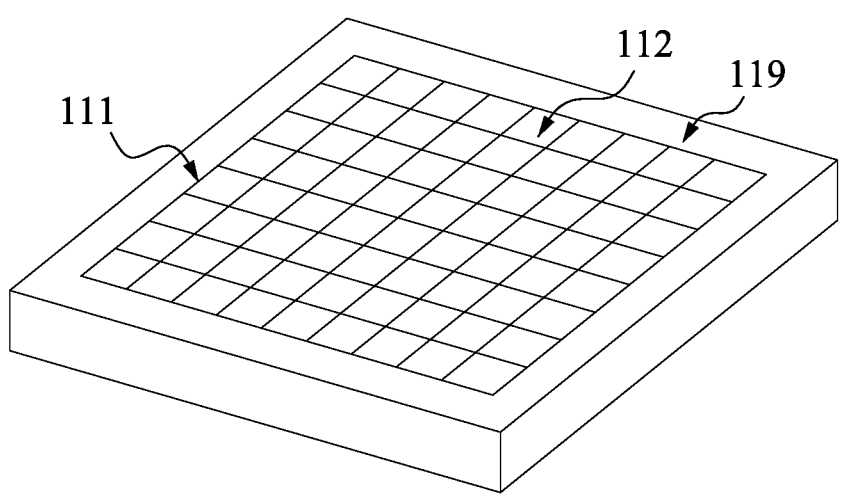
FIG. 2 is a perspective view of a thin film transistor (TFT) array substrate shown in FIG. 1.

FIG. 1 is a perspective view of a display device 100 according to one embodiment of the present invention. FIG. 2 is a perspective view of a thin film transistor (TFT) array substrate 110 shown in FIG. 1. As shown in FIG. 1 and FIG. 2, the display device 100 includes the thin film transistor (TFT) array substrate 110 and a front panel laminate (FPL) structure 120'. The present invention illustrates an electronic paper as an example, and the FPL structure 120' includes a front panel laminate (FPL) 120 and an adhesive layer 130. However, the present invention is not limited in this regard. The FPL structure may be a front panel of a liquid crystal display device, such as a liquid crystal display layer and an optical module of the liquid crystal display layer of the front panel. The adhesive layer 130 is located on the TFT array substrate 110, and the FPL 120 is located on the adhesive layer 130. In other words, the adhesive layer 130 is between the TFT array substrate 110 and the FPL 120, such that the TFT array substrate 110 and the FPL 120 are adhered to each other. In this embodiment, the adhesive layer 130 may be an optical clear adhesive (OCA), but the present invention is not limited in this regard. When the display device 100 is assembled, the adhesive layer 130 may coat on a top surface of the TFT array substrate 110 and/or a bottom surface of the FPL 120, and the present invention is not limited in this regard. In the drawings of the present invention, the display device 100 is a reflective display device, but the present invention is not limited in this regard.

Moreover, the TFT array substrate 110 has a display area 111 and a peripheral area 119 (i.e., non-display area). The peripheral area 119 is located outside the display area 111. The display area 111 has a plurality of pixel areas 112.

Figure 3:
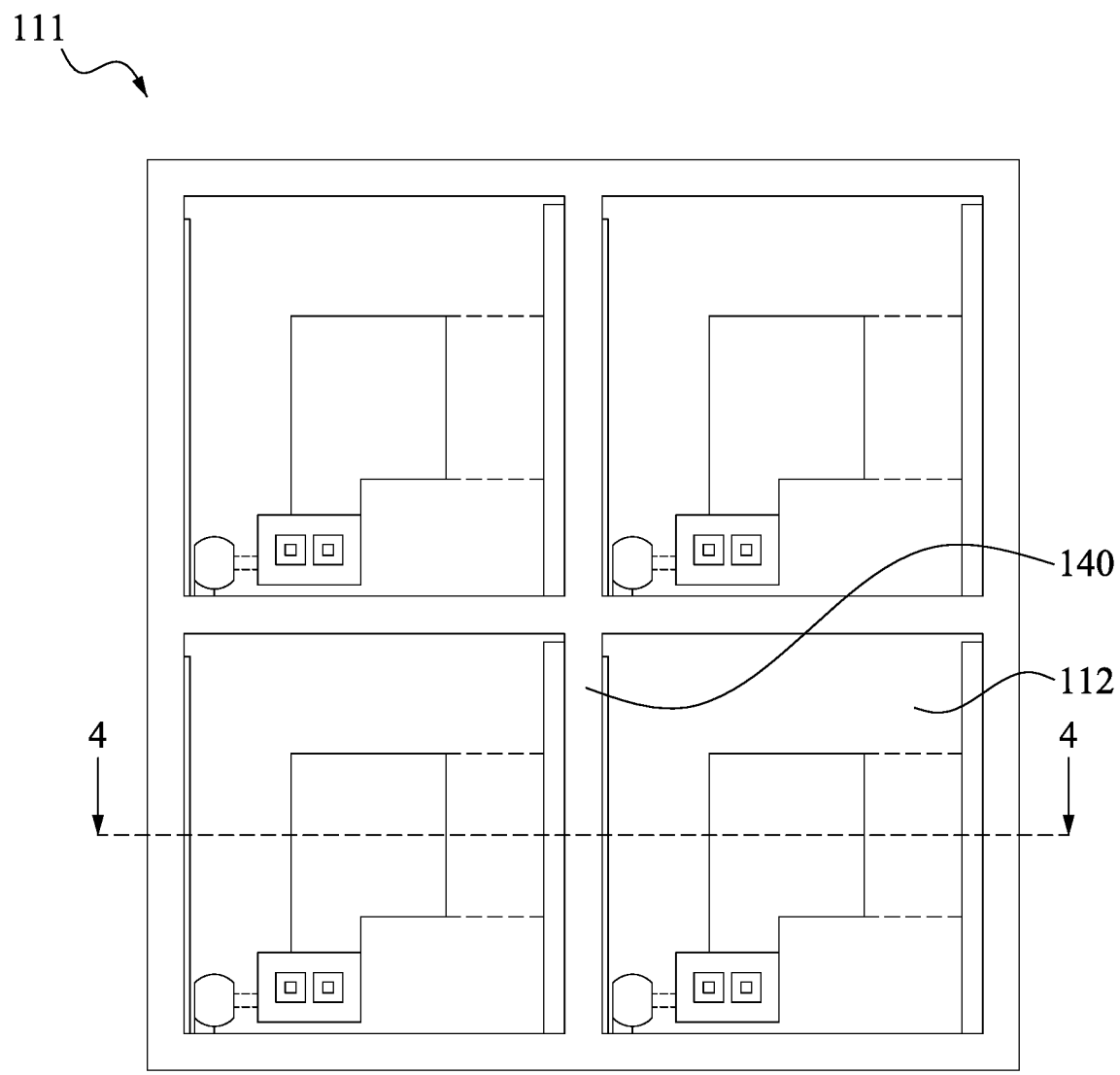
FIG. 3 is a partially enlarged view of a display area shown in FIG. 2.
Figure 5:
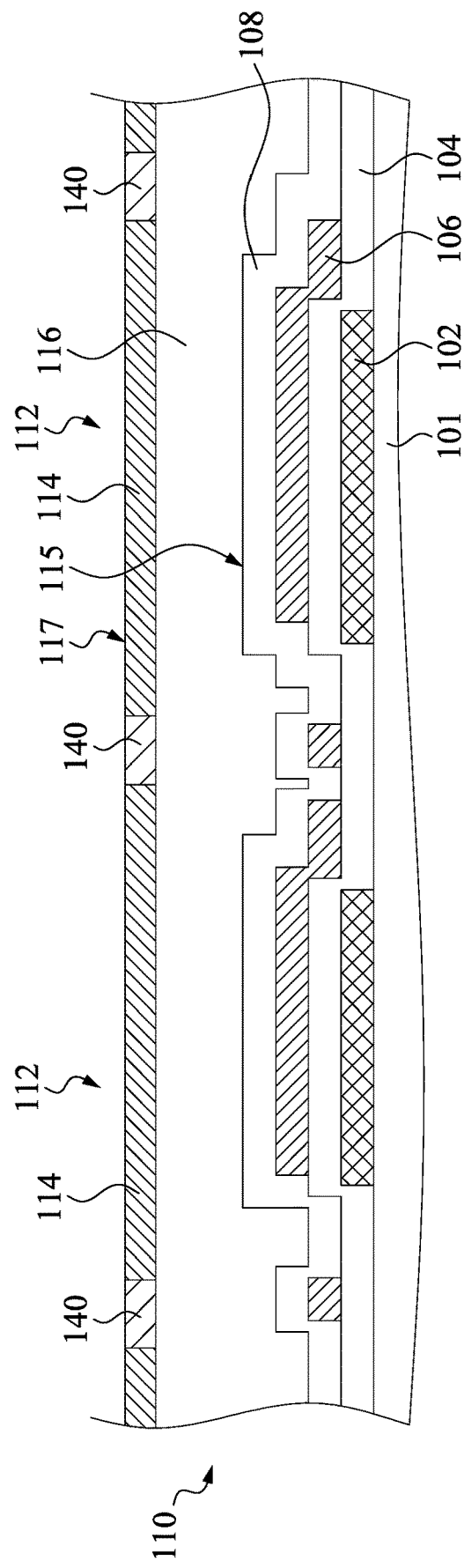
FIG. 5 is another embodiment of the display area shown in FIG. 4A.

FIG. 3 is a partially enlarged view of the display area 111 shown in FIG. 2. FIG. 4A is a cross-sectional view of the display area 111 taken along line 4-4 shown in FIG. 3. As shown in FIG. 3 and FIG. 4A, the display device 100 (see FIG. 1) includes an isolation structure 140. The TFT array substrate 110 has a plurality of pixel electrodes 114. In this embodiment, the pixel electrodes 114 may be made of a material including indium tin oxide (ITO), but the present invention is not limited in this regard. The isolation structure 140 is between the pixel electrodes 114, and is configured to form a first resistance between adjacent pixel electrodes 114. The isolation structure 140 extends to top surfaces 117 of the pixel electrodes 114, such that the isolation structure 140 partially covers the pixel electrodes 114. In another embodiment of the present invention (as shown in FIG. 5), the isolation structure 140 is merely located between the pixel electrodes 114, and does not extend to the top surfaces 117 of the pixel electrodes 114. The isolation structure 140 may be referred to as a structure having the first resistance, such as lateral resistances of the pixel electrodes 114. In this embodiment, the isolation structure 140 may be made of a material including silicon nitride (SiNx) or silicon oxide (SiOx), but the present invention is not limited in this regard. In addition, in this embodiment, as shown in FIG. 3, each of the pixel areas 122 is surrounded by the isolation structure 140.

FIG. 4B is a partially enlarged view of the isolation structure 140 and the pixel electrodes 140 shown in FIG. 4A after being covered by the adhesive layer 130. After the FPL 120 of FIG. 1 is adhered to the TFT array substrate 110 through the adhesive layer 130, the adhesive layer 130 may cover the pixel electrodes 114 and the isolation structure 140. In this embodiment, the isolation structure 140 has a T-shaped cross section, and has a bottom portion 142 and a top portion 144 on the bottom portion 142, in which a width W1 of the top portion 144 is greater than a width W2 of the bottom portion 142. The bottom portion 142 of the isolation structure 140 is filled in a gap between the pixel electrodes 114, while the top portion 144 of the isolation structure 140 extends to the top surfaces 117 of the pixel electrodes 114. Further, the adhesive layer 130 may be referred to as a structure having a second resistance, such as lateral resistances of the pixel electrodes 114.

Because the display device 100 (see FIG. 1) has the isolation structure 140 located between the pixel electrodes 114, the lateral resistances of the pixel electrodes 114 may be referred to as the sum of the first resistance of the isolation structure 140 and the second resistance of the adhesive layer 130. As a result, even if the adhesive layer 130 has a slight conductivity at a high-temperature ambience, the configuration of the isolation structure 140 can prevent parallel voltages between the pixel areas 112 from electric leakage through the adhesive layer 130, thereby improving display quality.

In this embodiment, the bottom portion 142 of the isolation structure 140 is in contact with sidewalls 118 of the pixel electrodes 114. The top portion 144 of the isolation structure 140 is in contact with the top surfaces 117 of the pixel electrodes 114. As shown in FIG. 4B, the top surfaces 117 of the pixel electrodes 114 are concurrently in contact with the adhesive layer 130 and the top portion 144 of the isolation structure 140. Moreover, the top portion 144 of the isolation structure 140 has a thickness H in a range from 1500 Å to 4500 Å. The top portion 144 of the isolation structure 140 has the width W1 in a range from 30 μm to 50 μm. The bottom portion 142 of the isolation structure 140 has the width W2 in a range from 5 μm to 15 μm. Through the configuration of the isolation structure 140, the lateral resistances of the pixel electrodes 114 may be effectively increased, thereby increasing the difficulty of currents passing through the pixel areas 112 (see FIG. 4A) to reach the purpose for decreasing the electric leakage of the pixel areas 112.

As shown in FIG. 4A, the TFT array substrate 110 has a substrate 101, a plurality of thin film transistors 115, and a planarization layer 116. The planarization layer 116 covers the thin film transistors 115, and the pixel electrodes 114 and the isolation structure 140 are located on the planarization layer 116. In this embodiment, a dielectric constant of the planarization layer 116 is smaller than a dielectric constant of the isolation structure 140. That is, the insulating property of the isolation structure 140 is greater than that of the planarization layer 116, such that the isolation structure 140 can provide sufficient lateral resistances to the pixel electrodes 114.

In this embodiment, the thin film transistor 115 includes a first metal layer 102, a first isolation layer 104, a second metal layer 106, and a second isolation layer 108. The first metal layer is disposed on the substrate 101 to serve as a gate electrode of the thin film transistor 115. The first isolation layer 104 covers the first metal layer 102 and the substrate 101 to serve as a gate insulator of the thin film transistor 115. The second metal layer 106 is disposed on the first isolation layer 104 to serve as a source/drain electrode of the thin film transistor 115. The second isolation layer 108 covers the second metal layer 106 to serve as a passivation layer of the thin film transistor 115. This embodiment is a structure of a bottom-gate thin film transistor as an example, but the present invention is not limited in this regard. The present invention is not limited to types of the thin film transistor. In other embodiments, the thin film transistor may be a top-gate thin film transistor, which still falls within the scope of the present invention.

Figure 6:
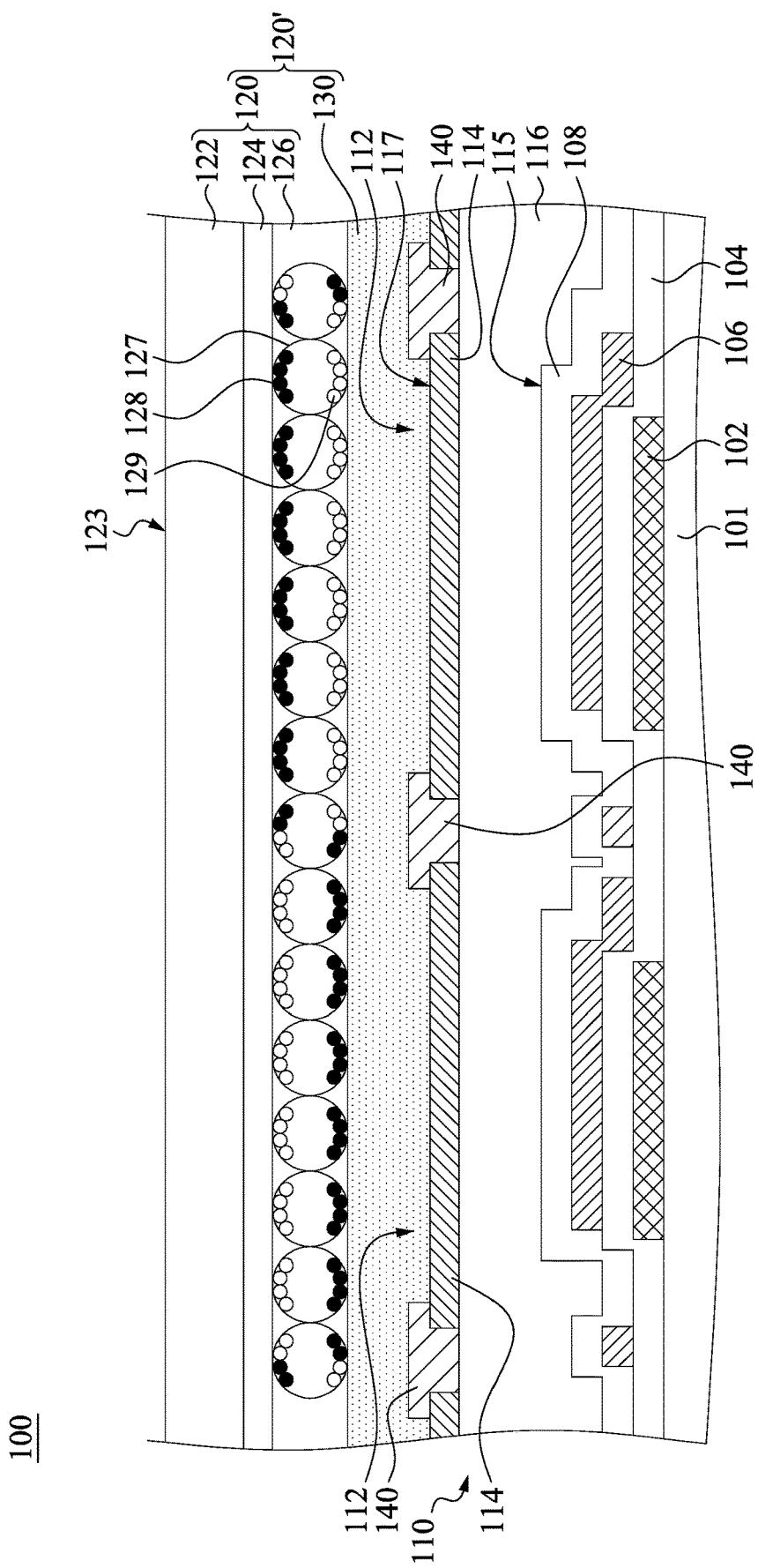
FIG. 6 is a cross-sectional view of the display area taken along line 6-6 shown in FIG. 1.

FIG. 6 is a cross-sectional view of the display device 100 taken along line 6-6 shown in FIG. 1. After the FPL 120 of FIG. 1 is adhered to the TFT array substrate 110 of FIG. 4A through the adhesive layer 130, the structure of FIG. 6 may be obtained. As shown in FIG. 6 and FIG. 1, the TFT array substrate 110 has the pixel electrodes 114. The isolation structure 140 is located between the pixel electrodes 114 and is configured to form the first resistance between adjacent pixel electrodes 114. The FPL structure 120' is located on the isolation structure 140 and the pixel electrodes 114, and has a display medium layer 126 therein. The display medium layer 126 may be a liquid crystal display layer, an electrophoresis display layer, or other types of display layers. In one embodiment, the FPL structure 120' is an electrophoresis display panel, and further includes the adhesive layer 130. The adhesive layer 130 covers the pixel electrodes 114 and the isolation structure 140, and has the second resistance. In addition, the aforementioned features may be described in another way. For example, the isolation structure 140 and the adhesive layer 130 are included by the TFT array substrate 110. In other words, the isolation structure 140 and the adhesive layer 130 may be referred to as portions of the TFT array substrate 110.

In this embodiment, the FPL structure 120' has the display medium layer 126 therein, such as an electronic ink layer. The display medium layer 126 has plural microcapsules 127, and each of the microcapsules 127 has plural charged particles 128 and 129. In this embodiment, the charged particles 128 may be black, while the charged particles 129 may be white. In another embodiment, the charged particles 128 and 129 may combinations of other colors, and the present invention is not limited in this regard.

Furthermore, the FPL structure 120' further has a light-transmissive sheet 122 and a common electrode 124. The common electrode 124 is located on a bottom surface 123 of the light-transmissive sheet 122, and is between the display medium layer 126 and the light-transmissive sheet 122. After the FPL 120 is adhered to the TFT array substrate 110 through the adhesive layer 130, the display medium layer 120 would be located between the common electrode 124 and the adhesive layer 130. In this embodiment, the common electrode 124 may be made of a material including indium tin oxide (ITO), but the present invention is not limited in this regard.

In use, the display device 100 can apply a voltage to the display medium layer 126 through the pixel electrodes 114 and the common electrode 124, such that the charged particles 128 and 129 are driven to move to enable the pixel areas 112 to display black, white or a gray level. Since the display device 100 utilizes incident light that irradiates the display medium layer 126 to realize displaying, such as sunlight or indoor ambient light, the display device 100 needs no backlight, which reduces power consumption. In addition, since the isolation structure 140 and the adhesive layer 130 are lateral resistances of the pixel electrodes 114, such a configuration can prevent parallel voltages between the pixel areas 112 from electric leakage through the adhesive layer 130, thereby improving display quality.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A display device, comprising:
   an array substrate having a plurality of pixel electrodes, wherein the array substrate has a planarization layer;
   an isolation structure between the pixel electrodes and configured to form a first resistance between the adjacent pixel electrodes; and
   a front panel laminate (FPL) structure located on the isolation structure and the pixel electrodes, and having a display medium layer therein, wherein the display medium layer is located above a top surface of the isolation structure, an entirety of the isolation structure is below a bottom of the display medium layer, the FPL structure comprises an adhesive layer covering the pixel electrodes and the isolation structure, and an entirety of the adhesive layer is located above a top of the planarization layer, wherein the adhesive layer is located between the display medium layer and the planarization layer, and the display medium layer uninterruptedly extends along a top surface of the adhesive layer.

2. The display device of claim 1, wherein the adhesive layer has a second resistance.

3. The display device of claim 1, wherein the isolation structure extends to top surfaces of the pixel electrodes.

4. The display device of claim 1, wherein the isolation structure has a bottom portion and a top portion on the bottom portion, and a width of the top portion is greater than a width of the bottom portion.

5. The display device of claim 4, wherein the bottom portion of the isolation structure is in contact with sidewalls of the pixel electrodes.

6. The display device of claim 4, wherein the top portion of the isolation structure is in contact with the adhesive layer of the FPL structure and top surfaces of the pixel electrodes.

7. The display device of claim 1, wherein the isolation structure is made of a material comprising silicon nitride or silicon oxide.

8. The display device of claim 1, wherein the FPL structure further has a light-transmissive sheet and a common electrode, the common electrode is located on a bottom surface of the light-transmissive sheet, and the display medium layer is located between the common electrode and the adhesive layer.

9. The display device of claim 1, wherein the array substrate has a plurality of pixel areas, and each of the pixel areas is surrounded by the isolation structure.

10. The display device of claim 1, wherein the array substrate has a plurality of thin film transistors covered by the planarization layer, and the pixel electrodes and the isolation structure are located on the planarization layer.

11. The display device of claim 1, wherein a dielectric constant of the planarization layer is smaller than a dielectric constant of the isolation structure.

12. An array structure, comprising:
    a substrate;
    a first metal layer disposed on the substrate;
    a first isolation layer covering the first metal layer;
    a second metal layer disposed on the first isolation layer;
    a second isolation layer covering the second metal layer;
    a planarization layer disposed on the substrate and covering the second isolation layer;
    a plurality of pixel electrodes disposed on the planarization layer;
    an isolation structure disposed on the planarization layer and between the pixel electrodes;
    a display medium layer located above a top surface of the isolation structure, wherein an entirety of the isolation structure is below a bottom of the display medium layer; and
    an adhesive layer covering the pixel electrodes and the isolation structure, wherein an entirety of the adhesive layer is located above a top of the planarization layer, and the adhesive layer is located between the display medium layer and the planarization layer, and the display medium layer uninterruptedly extends along a top surface of the adhesive layer.

13. The array structure of claim 12, wherein a dielectric constant of the planarization layer is smaller than a dielectric constant of the isolation structure.

14. The array structure of claim 12, wherein the isolation structure has a bottom portion and a top portion on the bottom portion, and a width of the top portion is greater than a width of the bottom portion.

15. The array structure of claim 12, wherein the isolation structure partially covers the pixel electrodes.

16. The array structure of claim 12, wherein the adhesive layer has a second resistance.

* * * * *